(12) United States Patent
Coe-Sullivan et al.

(10) Patent No.: US 9,093,657 B2
(45) Date of Patent: Jul. 28, 2015

(54) WHITE LIGHT EMITTING DEVICES

(75) Inventors: Seth A. Coe-Sullivan, Belmont, MA (US); Vladimir Bulovic, Lexington, MA (US); Jonathan Steckel, Cambridge, MA (US); Moungi G. Bawendi, Cambridge, MA (US); Polina O. Anikeeva, Cambridge, MA (US); Jonathan E. Halpert, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 12/162,840

(22) PCT Filed: Feb. 14, 2007

(86) PCT No.: PCT/US2007/003677
§ 371 (c)(1),
(2), (4) Date: Sep. 3, 2009

(87) PCT Pub. No.: WO2007/095173
PCT Pub. Date: Aug. 23, 2007

(65) Prior Publication Data
US 2010/0001256 A1  Jan. 7, 2010

Related U.S. Application Data

(60) Provisional application No. 60/773,119, filed on Feb. 14, 2006, provisional application No. 60/828,909, filed on Oct. 10, 2006.

(51) Int. Cl.
*H01L 33/08* (2010.01)
*H01L 33/00* (2010.01)
*H01L 51/50* (2006.01)
*B82Y 20/00* (2011.01)
*B82Y 30/00* (2011.01)

(52) U.S. Cl.
CPC ............. *H01L 51/5012* (2013.01); *B82Y 20/00* (2013.01); *B82Y 30/00* (2013.01); *H01L 33/00* (2013.01); *H01L 33/08* (2013.01)

(58) Field of Classification Search
CPC ................................. H01L 31/12; H01L 27/32
USPC ............................................................. 257/13
See application file for complete search history.

(56) References Cited

U.S. PATENT DOCUMENTS 7,279,832 B2    10/2007  Thurk et al.
2005/0051777 A1*  3/2005  Hill ................................. 257/72

(Continued)

FOREIGN PATENT DOCUMENTS

JP    2004-207610    7/2004
JP    2004-253175    9/2004

(Continued)

OTHER PUBLICATIONS

Goetz et al., "Development of Key Technologies for White Lighting Based on Light Emitting Diodes (LEDs)," Jun. 2004, www.osti.gov/bridge/servlets/purl/921943-cnYPQJ/.
Kim et al., "Contact printing of quantum dot light-emitting devices," 2008, *Nano Let*, 9(7): 2532-6.

(Continued)

*Primary Examiner* — Mohammad Choudhry
(74) *Attorney, Agent, or Firm* — Steptoe & Johnson LLP

(57) ABSTRACT

A white light emitting semiconductor nanocrystal includes a plurality of semiconductor nanocrystals.

17 Claims, 10 Drawing Sheets

(56) References Cited

U.S. PATENT DOCUMENTS

| | | | |
|---|---|---|---|
| 2005/0274944 A1* | 12/2005 | Jang et al. | 257/40 |
| 2006/0003183 A1* | 1/2006 | Helber et al. | 428/690 |
| 2006/0043361 A1 | 3/2006 | Lee et al. | |
| 2006/0063029 A1 | 3/2006 | Jang et al. | |
| 2008/0012031 A1 | 1/2008 | Jang et al. | |
| 2008/0122341 A1 | 5/2008 | Orita et al. | |
| 2009/0278141 A1 | 11/2009 | Coe-Sullivan et al. | |

FOREIGN PATENT DOCUMENTS

| | | |
|---|---|---|
| JP | A-2004-253175 | 9/2004 |
| JP | 2005-197010 | 7/2005 |
| JP | 2005-522005 | 7/2005 |
| JP | 2005-353595 | 12/2005 |
| JP | A-2005-340195 | 12/2005 |
| WO | WO 03/084292 | 10/2003 |
| WO | WO 2005-071764 | 8/2005 |

OTHER PUBLICATIONS

Anikeeva et al., "Electroluminescence from a mixed red-green-blue colloidal quantum dot monolayer," 2007, *Nano Let*, 7(8): 2196-2200.

Park et al., "White emission from polymer/quantum dot ternary nanocomposites by incomplete energy transfer," 2004, *Nanotechnology*, 15: 1217-1220.

Gosnell et al., "Cadium selenide nanocrystals as white-light phosphors," 2006, *Proc. of SPIE*, 6337: 63370A.

Bowers et al., "White-light emission from magic-sized cadmium selenide nanocrystals," 2005, *JACS*, 127(44): 15378-15379.

Salisbury, Davd F., "Quantum dots that produce white light could be the light bulb's successor," 2005, www.vanderbilt.edu.

Coe-Sullivan, "Hybrid Organic/Quantum Dot Thin Film Structures and Devices," PhD thesis, Oct. 21, 2005, MIT, Boston, MA, USA.

Coe-Sullivan et al., "Method for fabrication of saturated RGB quantum dot light emitting devices," Proc. of SPIE vol. 5739 pp. 108-115 (2005).

* cited by examiner

WHITE LIGHT EMITTING DEVICES

FEDERALLY SPONSORED RESEARCH OR DEVELOPMENT

This invention was made with government support under grant number FA9550-04-1-0462 awarded by the Air Force, grant number DMR0213282 awarded by the National Science Foundation, and grant number DAAD19-02-D-0002 awarded by the Army. The U.S. Government has certain rights in this invention.

CLAIM OF PRIORITY

This application claims priority under 35 USC 371 to International Application No. PCT/US2007/003677, filed on Feb. 14, 2007, which claims priority to U.S. Provisional Application Ser. No. 60/773,119, filed on Feb. 14, 2006, which claims priority to U.S. Provisional Application Ser. No. 60/828,909, filed on Oct. 10, 2006, each of which is incorporated by reference in its entirety.

TECHNICAL FIELD

The present invention relates to white light emitting devices including semiconductor nanocrystals.

BACKGROUND

Semiconductor nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing nanocrystal size. Consequently, both the optical absorption and emission of nanocrystals shift to the blue (i.e., to higher energies) as the size of the nanocrystals decreases. Semiconductor nanocrystals can have a narrow fluorescence band whose emission wavelength is tunable with the size and material of the nanocrystals.

Light-emitting devices can be used, for example, in displays (e.g., flat-panel displays), screens (e.g., computer screens), and other items that require illumination. Accordingly, the brightness of the light-emitting device is an important feature of the device. Also, low operating voltages and high efficiencies can improve the viability of producing emissive devices. In many applications, long device lifetime is desirable.

SUMMARY

Stable, white light emitting materials are highly desirable for display applications. Luminescent semiconductor nanocrystals can be more stable than organic light emitting compounds. Semiconductor nanocrystals can also have narrow emission band widths compared to organic compounds.

In general, a light emitting device includes an emissive layer including a plurality of semiconductor nanocrystals, the plurality of semiconductor nanocrystals generating white light upon excitation. The plurality of nanocrystals can include red, green and blue light emitting nanocrystals. At least one of the nanocrystals can include a core. The nanocrystal can include an overcoating on the core. The overcoating can include a second semiconductor material. The device can have an external quantum efficiency of at least 0.20%. The device can have CIE coordinates of (0.35, 0.41). The device can have a color rendering index (CRI) of 86 as compared to a 5500K black body reference.

In another aspect, a light emitting device includes a first electrode, a hole injection layer in contact with the first electrode, a hole transporting layer in contact with the hole injection layer, a hole blocking layer in contact with the hole transporting layer, an electron transporting layer in contact with the hole blocking layer, a second electrode in contact with the electron transporting layer, and a plurality of semiconductor nanocrystals between the hole transporting layer and the hole blocking layer, the plurality of semiconductor nanocrystals including at least two distinct color emissions when excited.

The first electrode can be a transparent electrode. The hole injection layer can include a conducting polymer. The hole transporting layer can includes a benzidine. The hole blocking layer can include a triazole. The electron transporting layer can include a metal complex. The second electrode can include a metal. The plurality of semiconductor nanocrystals can include at least three distinct color emissions when excited. Each distinct color emission is a local emission maximum in the photoluminescence spectrum of the plurality of semiconductor nanocrystals.

Semiconductor nanocrystals can be used as the lumophore in a light emitting device. Because semiconductor nanocrystals can have narrow emission linewidths, can be photoluminescent efficient, and emission wavelength tunable, they can be a desirable lumophore. Semiconductor nanocrystals can be dispersed in a liquid and are therefore compatible with thin-film deposition techniques such as stamping, printing, spin-casting, drop-casting, and dip coating. However, bulk semiconductor nanocrystal solids resulting from these deposition techniques have poor electrical transport properties in solid state light emitting devices. Rather than a bulk solid, a monolayer of semiconductor nanocrystals can be used in a light emitting device. A monolayer provides the beneficial light emission properties of semiconductor nanocrystals while minimizing the impact on electrical performance.

Devices using organic materials for the hole transporting or electron transporting layers (or both) can have high efficiency electricity-to-light conversion, but can suffer from short lifetimes due to the inherent instabilities of the organic materials. The inorganic nanocrystals themselves can be inherently more stable than their organic lumophore counterparts, as evidenced by photoluminescence studies. A light emitting device (LED) that utilizes semiconductor nanocrystals for luminescence and inorganic semiconductors for electrical transport can achieve superior optoelectronic performance and long term stability. The inorganic semiconductors can be deposited by a low temperature method, such as sputtering, vacuum vapor deposition, ink jet printing, or ion plating.

Semiconductor nanocrystals can be deposited on a substrate using microcontact printing. Advantageously, microcontact printing allows micron-scale or nano-scale (e.g., less than 1 mm, less than 500 μm, less than 200 μm, less than 100 μm, less than 25 μm, or less than 1 μm) patterning of features on a surface. In particular, a monolayer of semiconductor nanocrystals can be deposited by microcontact printing. This approach can allow a substantially dry (i.e., substantially solvent-free) application of a patterned semiconductor nanocrystal film on a substrate. A wider variety of substrates can thus be used, because the choice of substrate is not constrained by solubility and surface chemistry requirements. See, for example, U.S. application Ser. No. 11/253,612, filed Oct. 21, 2005, which is incorporated by reference in its entirety.

In another aspect, a method of forming a device includes placing a layer including a plurality of semiconductor nanocrystals between a first electrode and a second electrode, the plurality of semiconductor nanocrystals generating white light upon excitation, for example, by printing, stamping or otherwise depositing the nanocrystals on a surface. A method of generating light includes applying a light-generating potential across the first electrode and the second electrode of the device. A display can include a plurality of the light emitting devices.

White-light LEDs based on electroluminescence from a monolayer of mixed red, green and blue light emitting colloidal nanocrystals in a hybrid organic/inorganic structure can be generated. Colloidal nanocrystals, can allow for highly luminescent and reproducible mixed nanocrystal materials for device applications are used. White nanocrystal-LEDs can exhibit external quantum efficiencies of 0.36%, CIE (Commission Internationale de l'Eclairage) coordinates of (0.35, 0.41) at video brightness, and color rendering index (CRI) of 86 as compared to a 5500K black body reference. Independent processing of the organic charge transport layers and the mixed nanocrystal luminescent layer allows for precise tuning of the emission spectrum without changing the device structure, by simply changing the ratio of different color nanocrystals in the electroluminescent layer. The demonstrated devices suggest future use of white nanocrystal-LEDs in solid-state lighting and information display applications.

Other features, objects, and advantages of the invention will be apparent from the description and drawings, and from the claims.

DETAILED DESCRIPTION

Figure 1:
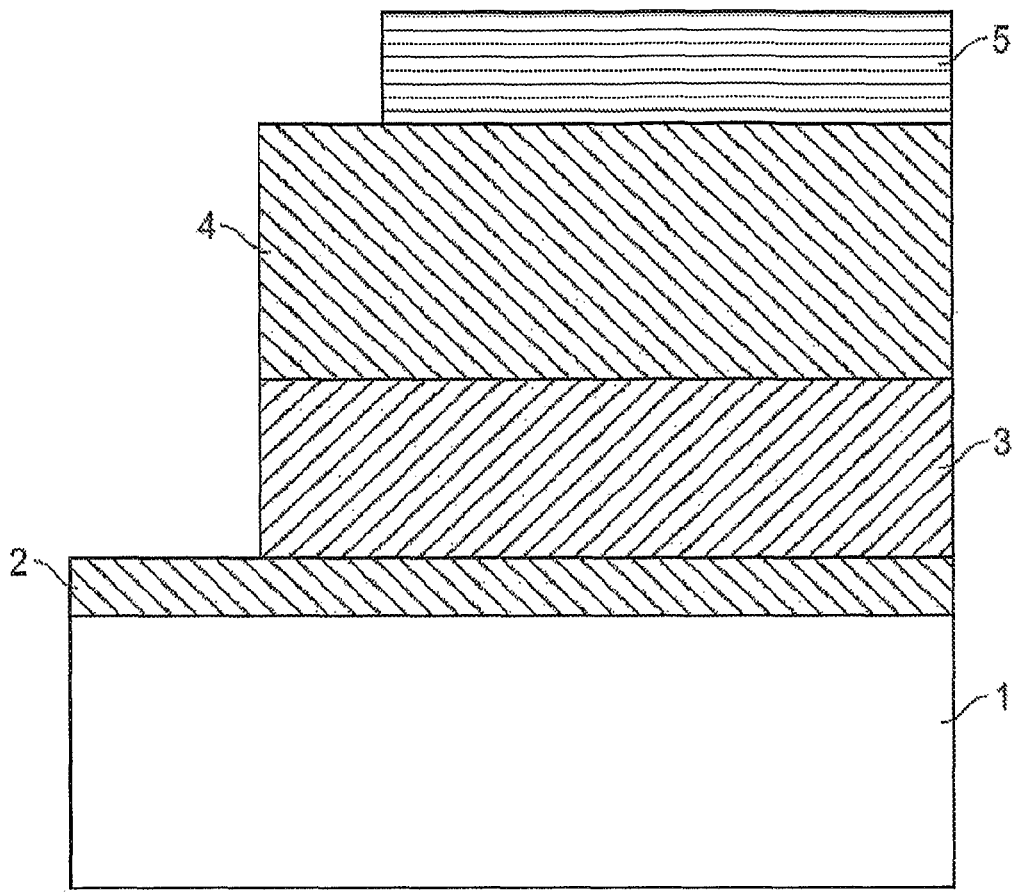
FIG. 1 is a schematic drawing depicting a light-emitting device.

A light emitting device capable of emitting white light is described, for example, in U.S. Application No. 60/773,119, filed Feb. 14, 2006, which is incorporated by reference in its entirety.

Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. The semiconductor can be an alloy, for example, an alloy of Group II-VI compounds, such as an alloy of CdS and ZnS.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, di oxygen, an ammonium salt, or a tris(silyl) pnictide. Suitable X donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide ($(TMS)_3P$), tris (trimethylsilyl) arsenide ($(TMS)_3As$), or tris(trimethylsilyl) antimonide ($(TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

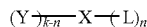

$$(Y)_{k-n}-X-(L)_n$$

wherein k is 2, 3 or 5, and n is 1, 2, 3, 4 or 5 such that k-n is not less than zero; X is O, S, S=O, $SO_2$, Se, Se=O, N, N=O, P, P=O, As, or As=O; each of Y and L, independently, is aryl, heteroaryl, or a straight or branched $C_{2-12}$ hydrocarbon chain optionally containing at least one double bond, at least one triple bond, or at least one double bond and one triple bond. The hydrocarbon chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by —O—, —S—, —N($R^a$)—, —N($R^a$)—C(O)—O—, —O—C(O)—N($R^a$)—, —N($R^a$)—C(O)—N($R^b$)—, —O—C(O)—O—, —P($R^a$)—, or —P(O)(R)—. Each of $R^a$ and $R^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, or phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

A nanocrystal with a core including zinc, cadmium and sulfur, for example ZnCdS, an alloy of ZnS and CdS, having a diameter between 5 and 15 nanometers, for example, 5, 6, 7, 8, 9, 10, 11, 12, 13 14 or 15 nm, can emit light when excited by irradiation.

The nanocrystals can have 20-40% quantum yield. The ZnCdS alloyed nanocrystals can be overcoated, for example, with ZnS, increasing the quantum yield to 40%-60%. These materials can be tuned to emit anywhere from 415 nm to 510 nm with full width half max of 25-30 nm by adjusting the composition and/or diameter of the nanocrystals.

A light emitting device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and hole localize on the same molecule, an exciton is formed, which can recombine to emit light. The device can include an emissive layer between the HTL and the ETL. The emissive layer can include a material selected for its emissive properties, such as emission wavelength or linewidth. See, for example, U.S. application Ser. No. 11/071,244, filed Mar. 4, 2005 and U.S. application Ser. No. 11/354,185, filed Feb. 15, 2006, each of which is incorporated by reference in its entirety. A blue light emitting device can be part of a white light emitting device. See, for example, U.S. Application No. 60/773,119, filed Feb. 14, 2006, which is incorporated by reference in its entirety.

Figure 2:
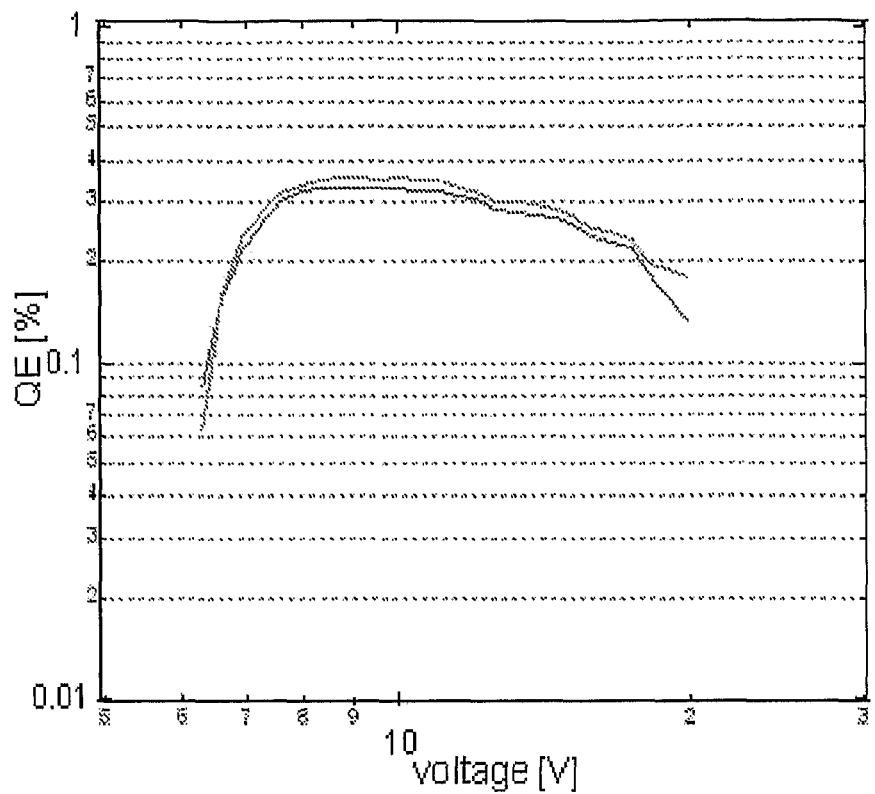
FIG. 2 is a diagram depicting an external quantum efficiency versus voltage for a light emitting device.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 can be a hole transporting layer and second layer 4 can be an electron transporting layer. At least one layer can be non-polymeric. The layers can include an inorganic material. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure. First layer 3 can include a plurality of semiconductor nanocrystals, for example, a substantially monodisperse population of nanocrystals. Alternatively, a separate emissive layer (not shown in FIG. 1) can be included between the hole transporting layer and the electron transporting layer. The separate emissive layer can include the plurality of nanocrystals. A layer that includes nanocrystals can be a monolayer of nanocrystals. Representative efficiencies are shown in FIG. 2.

Light emitting devices including semiconductor nanocrystals can be made by spin-casting a solution containing the HTL organic semiconductor molecules and the semiconductor nanocrystals, where the HTL formed underneath of the semiconductor nanocrystal monolayer via phase separation (see, for example, U.S. patent application Ser. No. 10/400, 907, filed Mar. 28, 2003, and U.S. Patent Application Publication No. 2004/0023010, each of which is incorporated by reference in its entirety). This phase separation technique reproducibly placed a monolayer of semiconductor nanocrystals between an organic semiconductor HTL and ETL, thereby effectively exploiting the favorable light emission properties of semiconductor nanocrystals, while minimizing their impact on electrical performance. Devices made by this technique were limited by impurities in the solvent, by the necessity to use organic semiconductor molecules that are soluble in the same solvents as the semiconductor nanocrystals. The phase separation technique was unsuitable for depositing a monolayer of semiconductor nanocrystals on top of both a HTL and a HIL (due to the solvent destroying the underlying organic thin film). Nor did the phase separation method allow control of the location of semiconductor nanocrystals that emit different colors on the same substrate; nor patterning of the different color emitting nanocrystals on that same substrate.

Moreover, the organic materials used in the transport layers (i.e., hole transport, hole injection, or electron transport layers) can be less stable than the semiconductor nanocrystals used in the emissive layer. As a result, the operational life of the organic materials limits the life of the device. A device with longer-lived materials in the transport layers can be used to form a longer-lasting light emitting device.

The substrate can be opaque or transparent. A transparent substrate can be used to in the manufacture of a transparent LED. See, for example, Bulovic, V. et al., Nature 1996, 380, 29; and Gu, G. et al., Appl. Phys. Lett. 1996, 68, 2606-2608, each of which is incorporated by reference in its entirety. Transparent LEDs can be used in applications such as a head-up display, as on a helmet visor or a vehicle windscreen. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg: Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms.

A hole transporting layer (HTL) or an electron transporting layer (ETL) can include an inorganic material, such as an inorganic semiconductor, or an organic material. The layer can be any material with a band gap greater than the emission energy of the emissive material.

The layers can be deposited on a surface of one of the electrodes by spin coating, dip coating, vapor deposition, sputtering, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device. See U.S. patent application Ser. No. 11/253, 612, filed Oct. 21, 2005, U.S. patent application Ser. No. 11/253,595, and Ser. No. 11/253,612, both filed Oct. 21, 2005, and Ser. No. 11/032,163, filed Jan. 11, 2005, each of which is incorporated by reference in its entirety.

When the electron and hole localize on a nanocrystal, emission can occur at an emission wavelength. The emission has a frequency that corresponds to the band gap of the quantum confined semiconductor material. The band gap is a function of the size of the nanocrystal.

Individual devices can be formed at multiple locations on a single substrate to form a display. The display can include devices that emit at different wavelengths. By patterning the substrate with arrays of different color-emitting materials, a display including pixels of different colors can be formed. In some applications, the substrate can include a backplane. The backplane includes active or passive electronics for controlling or switching power to individual pixels. Include a backplane can be useful for applications such as displays, sensors, or imagers. In particular, the backplane can be configured as an active matrix, passive matrix, fixed format, directly drive, or hybrid. The display can be configured for still images, moving images, or lighting. A lighting display can provide white light, monochrome light, or color-tunable light. See, e.g., U.S. patent application Ser. No. 11/253,612, filed Oct. 21, 2005, which is incorporated by reference in its entirety.

The device can be made in a controlled (oxygen-free and moisture-free) environment, preventing the quenching of luminescent efficiency during the fabrication process. Other multilayer structures may be used to improve the device performance (see, for example, U.S. patent application Ser. Nos. 10/400,907 and 10/400,908, filed Mar. 28, 2003, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The excited state lifetime ($\tau$) of the nanocrystal is much shorter ($\tau \sim 10$ ns) than a typical phosphor ($\tau > 0.5$ μs), enabling nanocrystal-light emitting devices to operate efficiently even at high current density.

Devices can be prepared that emit visible or infrared light. The size and material of a semiconductor nanocrystal can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm.

The device can be thermally treated after application of all of the transport layers. The thermal treatment can further enhance injection of charges into the nanocrystals, as well as eliminate the organic capping groups on the nanocrystals. The instability of the capping groups can contribute to device instability.

With greater efficiency, better color tunability and fewer restrictions on shape, size or mounting, white light LED panels could someday replace incandescent or fluorescent light bulbs in many lighting applications. Several types of solid state devices have already achieved efficient white light luminescence (in the range of 15 μm/W to 30 lm/W), including single-chip InGaN white LEDs (WLEDs), multi-chip WLEDs, ZnSe-based WLEDs, and white organic LEDs (OLEDs), which can be further divided into single unit white OLEDs (WOLEDs), stacked white OLEDs (SOLEDs), and white LEDs that use blue OLED pumped inorganic phosphors to generate a broad white spectrum. See, for example, Y. Shimizu et al. U.S. Pat. No. 5,998,925, Schubert, E. F. et al., *Science*, 2005, 308, 1274, H. Matsubara et al. U.S. Pat. No. 6,509,651, D'Andrade et al. *Adv. Mater.*, 2004, 16, 624, Kanno, H. et al. *Adv. Mater.* 2006, 18, 339 and Duggal, A. et al., *Appl. Phys. Lett.*, 2002, 80, 3470, each of which is incorporated by reference in its entirety. Single-chip InGaN WLEDs provide low cost high luminance efficiency devices for general lighting, but they suffer from poor color rendering index (CRI), because their emission profiles consist of a blue InGaN component and a yellow phosphor emission (typically yttrium aluminum garnet YAG). Multi-chip WLEDs consist of red, green, and blue light emitting sub-units that lead to a high color rendering index (CRI), but they are relatively expensive and require a complex feedback system due to different degradation rates of the sub-units. In ZnSe-based WLEDs white emission is achieved by mixing the blue emission of ZnS and yellow emission of ZnSe substrate; these devices have lower efficiency and shorter lifetimes as compared to the InGaN based LEDs. Finally WOLEDs and SOLEDs combine the electroluminescence from three types of organic phosphors to achieve white luminescence with high electrophosphorescent efficiencies (up to 10% for WOLEDs and 30% for SOLEDs). However, the organic dyes that generate white electroluminescence are generally less photostable than inorganic materials, a quality which does not limit their use in consumer electronics displays, but which challenges their use in high brightness applications such as room lighting. LEDs based on colloidal quantum dots (nanocrystals), or nanocrystal-LEDs (see, for example, Coe, S. et al. *Nature*, 2002, 420, 800, Zhao, J. et al. *Nano Lett.*, 2006, 6, 463, Mueller, A. H. et al. *Nano Lett.*, 2005, 5, 1039, each of which is incorporated by reference in its entirety), display efficiencies and brightness approaching that of OLEDs, but nanocrystal lumophores can be synthesized with exceptional photostability, as well as color tunability through the visible range (Murray, C. B. et al. *J. Am. Chem. Soc.*, 1993, 115, 8706, Hines, M. A., et al. *J. Phys. Chem.*, 1996, 100, 468, Steckel, J. S., *Angew. Chem. Int. Ed.*, 2004, 43, 2154, each of which is incorporated by reference in its entirety), enabling high quality color rendering with luminescence from a mixed color nanocrystal layer, as demonstrated in this study.

Previous work on nanocrystal-LEDs using organic semiconductor charge carrier transport layers has created saturated color red, green, and blue (RGB) monochrome nanocrystal-LEDs with efficiencies of 2.0%, 0.5% and 0.2%, respectively. See, for example, Coe, S. et al. *Nature*, 2002, 420, 800, Steckel, J. S. et al. *Angew. Chem. Int. Ed.*, 2004, 43, 2154, Coe-Sullivan, S., *Adv. Funct. Mater.*, 2005, 15, 1117, S. Coe-Sullivan, PhD Thesis, Department of Electrical Engineering and Computer Science, Massachusetts Institute of Technology, 2005, each of which is incorporated by reference in its entirety. nanocrystal-LEDs with somewhat lower efficiencies have also been fabricated using inorganic transport layers, which are used to replace the air and moisture sensitive organic films. See, for example, Mueller, A. H. et al. *Nano Lett.*, 2005, 5, 1039, each of which is incorporated by reference in its entirety. To date, only a few attempts have been made to fabricate a white-light LED using colloidal nanocrystal emitters. One of the first white nanocrystal-LEDs utilized broad spectral emission, originating from the charge trap states deep inside the nanocrystal band gap (deep trap states), that covered nearly the entire visible spectrum. See, for example, Gao, M. et al. *Adv. Mater.*, 1997, 9, 802, which is incorporated by reference in its entirety. Recently, similar approach has been taken in studies by Bowers, et al. *J. Am. Chem. Soc.*, 2005, 127, 15378, and Chen, et al. *Appl. Phys. Lett.*, 2005, 86, 131905, each of which is incorporated by reference in its entirety, in which deep trap nanocrystal luminescence was photoexcited by a commercially available external ultra-violet LED. While in these studies the emitted light appears white, luminescence of deep trap emission is inefficient, and the materials are not easily reproducible from one synthetic preparation to the next. Different approaches have been taken by a number of groups using either red (see, for example, Y. Li et al. *J. Appl. Phys.*, 2005, 97, 113501, which is incorporated by reference in its entirety) or green (see, for example, Park, J. H. et al. *Nanotechnology*, 2004, 15, 1271, which is incorporated by reference in its entirety) emitting nanocrystals along with efficient green or blue light emitting organic materials, respectively, to provide the missing color component needed to create a white LED. Though these devices exhibited good CRI and CIE (Commission Internationale de l'Eclairage) coordinates close to ideal (0.33, 0.33), they maintain the color tunability and stability issues characteristic of OLEDs. In other studies, blue emission from commercially available InGaN chip was used to excite red and green colloidal nanocrystals, which upon nanocrystal reemission composed a white luminescence spectrum. See, for example, J. Lee et al., *Adv. Mater.*, 2000, 12 15, 1102, and Chen, H.-S. et al. *Technol. Lett.*, 2006, 18, 193, each of which is incorporated by reference in its entirety.

Of all the devices discussed so far, there has not been, as of yet, any report in the literature of a white LED that utilizes electrically driven luminescence of red, green, and blue light emitting colloidal nanocrystals. For this reason we present an efficient, stable, white emitting nanocrystal-LED that makes use of reproducibly synthesized, high quantum yield nanocrystal materials with narrow emission bandwidths incorporated into a device structure similar to a previously reported nanocrystal-LED. See, for example, Coe, S. et al. *Nature*, 2002, 420, 800, which is incorporated by reference in its entirety. Recent advances in fabrication of nanocrystal monolayers allow for independent processing of the nanocrystal emitting layer (see, for example, Coe-Sullivan, S. et al., *Adv. Funct. Mater.*, 2005, 15, 1117, and S. Coe-Sullivan, PhD Thesis, Department of Electrical Engineering and Computer Science, Massachusetts Institute of Technology, 2005, each of which is incorporated by reference in its entirety) and the carrier transport layers, making fabrication of white or multicolor nanocrystal-LEDs equivalent to fabrication of monochromatic devices. The use of three RGB nanocrystal materials allow the CIE coordinates and CRI of the white nanocrystal-LED to be adjusted by simply changing the concentration of each type of nanocrystals in the nanocrystal deposition step.

Figure 3C:
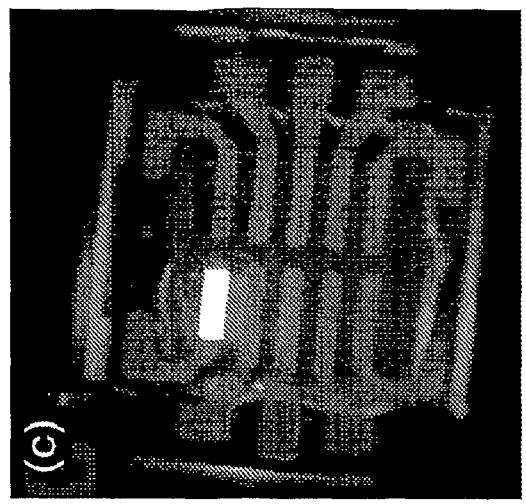
FIG. 3 (*a*) is a diagram depicting an atomic force microscope phase image of blue light emitting semiconductor nanocrystals (QDs) forming approximately 1.1 monolayers on top of 40 nm thick TPD film; (b) a diagram depicting a device cross-section of the white QD-LEDs; and (c) a photograph depicting a white QD-LED in operation at 10 V of applied forward bias.
Figure 3B:
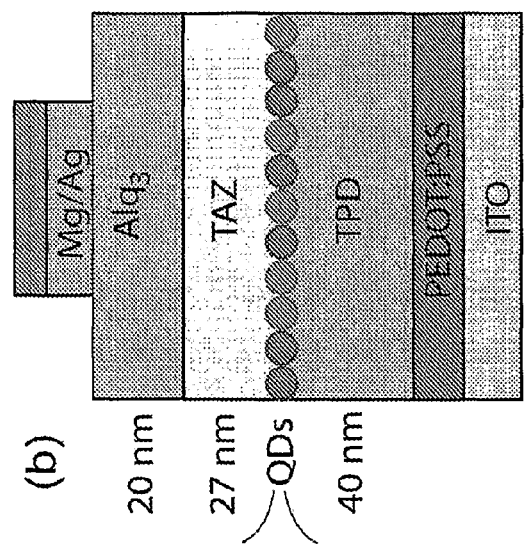

Our devices consist of an indium tin oxide (ITO) anode on top of a glass substrate with a layer of conducting polymer poly(3,4-ethylenedioxythiophene):poly(styrenesulfonate) PEDOT:PSS as the hole injection layer, 40 nm thick hole transporting layer (HTL) of N,N'-Bis(3-methylphenyl)-N,N'-bis(phenyl)benzidine (TPD), an emissive monolayer of colloidal nanocrystals, 27 nm thick hole blocking layer (HBL) of 3,4,5-triphenyl-1,2,4-triazole (TAZ) (that limits exciton formation to near/at nanocrystal sites), 20 nm thick electron transporting layer (ETL) of tris-(8-hydroxyquinoline) aluminum ($Alq_3$), and 100 nm thick cathode of magnesium silver alloy, coated with a 20 nm thick silver protective layer (see FIG. 3b). Three types of colloidally synthesized nanocrystals (see Experimental section) to achieve the red, green and blue spectral components of the white LED were used. The red nanocrystal solution consisted of CdSe/ZnS core-shell nanocrystals with the photoluminescence peak at wavelength $\lambda=620$ nm. The green nanocrystal solution consisted of ZnSe/CdSe alloyed cores overcoated with ZnS with the photoluminescence peak at $\lambda=540$ nm. Finally, the blue nanocrystal solution consisted of ZnCdS alloyed nanocrystals with the photoluminescence peak at $\lambda=440$ nm. nanocrystal solutions for the white nanocrystal-LEDs were prepared by mixing red, green, and blue nanocrystal solutions with a ratio of 1:2:10, for R:G:B, according to the surface coverage.

Figure 4A:
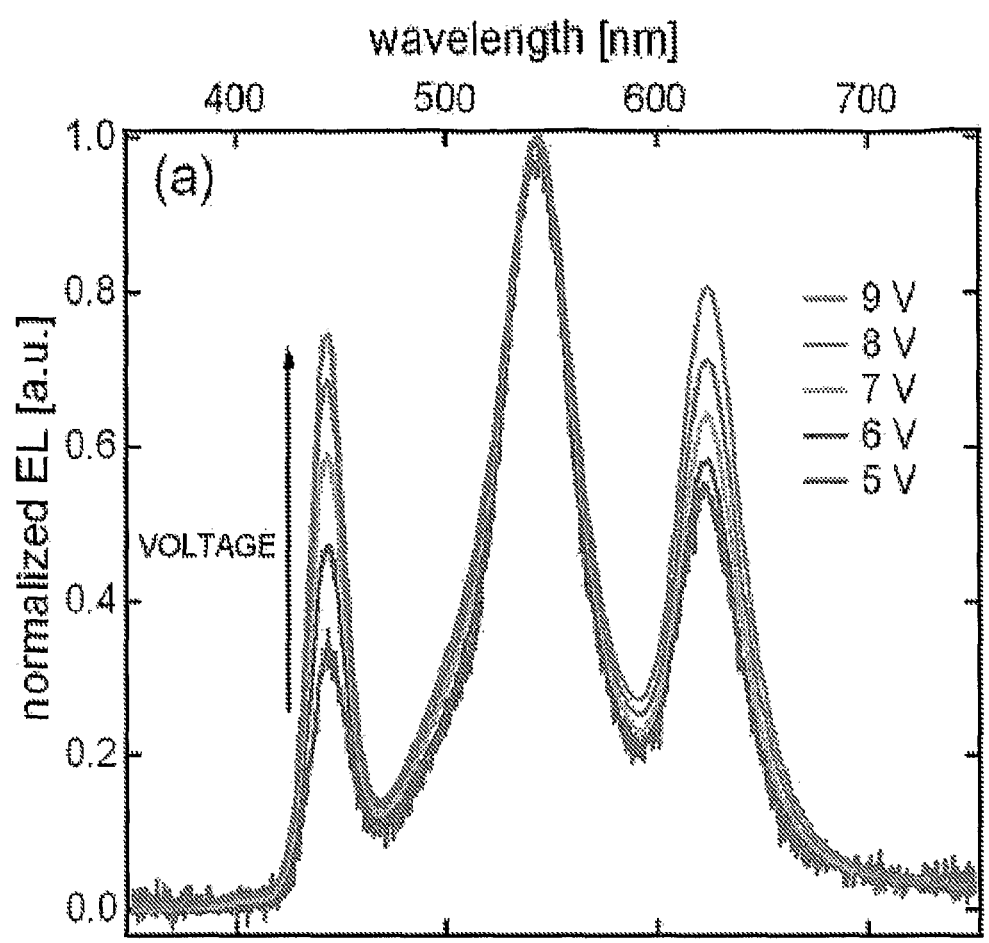
FIG. 4 (*a*) is a diagram depicting a normalized EL spectra of a white QD-LED for a set of increasing applied voltages in which the relative intensity of red and blue light emitting QD spectral components increase in comparison to the green QD component at higher biases; (b) is a diagram depicting normalized electroluminescence spectra of red, green and blue monochrome QD-LEDs (red, green and blue lines, respectively); and (c) a diagram depicting CIE coordinates of the red, green, blue QD-LEDs (triangles), in which circle symbols show the evolution of CIE coordinates and CRI of the white QD-LEDs upon increasing applied bias.
Figure 4B:
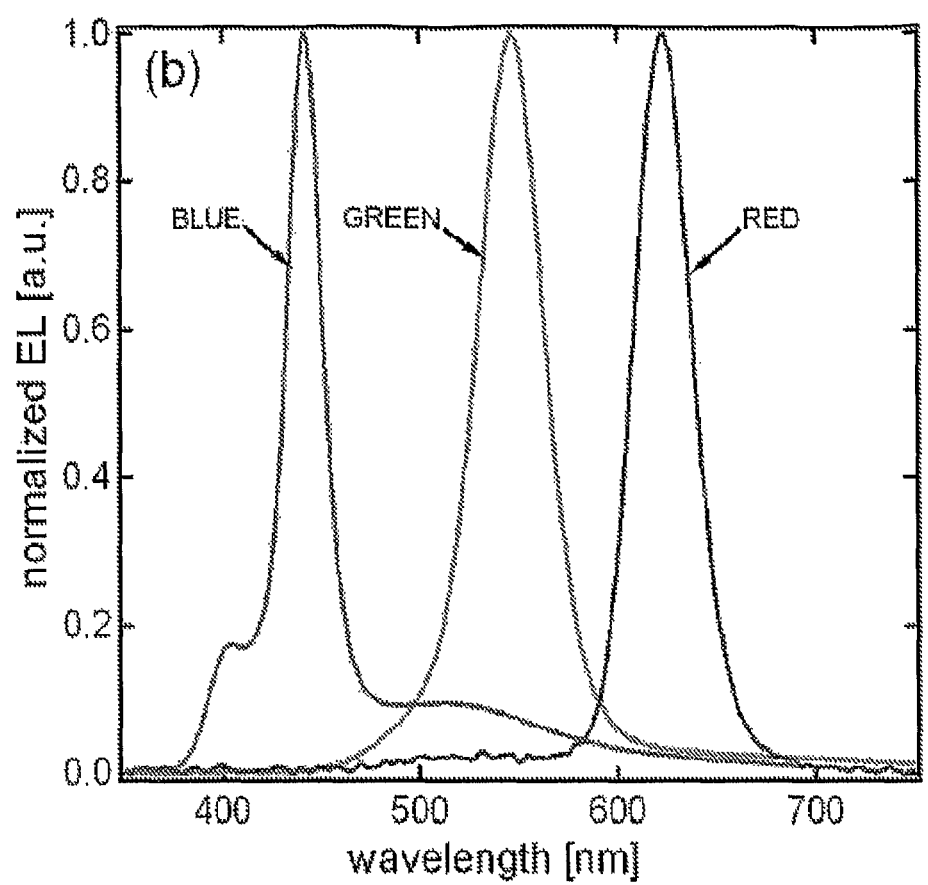

Electroluminescence spectra for the red, green, blue and white light emitting nanocrystal-LEDs are measured at near video brightness (FIG. 4). The electroluminescence of red and green nanocrystal-LEDs corresponds to the color-saturated photoluminescence spectra characteristic of colloidal nanocrystals, with CIE coordinates of (0.65, 0.34) and (0.31, 0.65), respectively. The blue light emitting nanocrystal-LED spectrum has a dominant nanocrystal component and weaker $Alq_3$ and TPD emission, indicating efficient energy transfer (see, for example, Förster, Th.; *Annalen der Physik*, 1948, 6, 55, and Kuhn, H., *J. Chem. Phys.*, 1970, 53, 101, each of which is incorporated by reference in its entirety) and downconversion of deep blue nanocrystal luminescence by $Alq_3$, (expected from the spectral overlap of $Alq_3$ absorption and blue nanocrystal photoluminescence). In contrast, spectral overlap of TPD photoluminescence and blue nanocrystal absorption is insufficient to provide complete quenching of TPD electroluminescence via energy transfer from TPD to blue light emitting nanocrystals. CIE coordinates of the blue nanocrystal-LEDs are (0.19, 0.11). Due to the presence of the hole blocking TAZ layer, one would expect that the blue nanocrystal monolayer is physically separated from the $Alq_3$ film inhibiting nanocrystal-to-$Alq_3$ energy transfer and $Alq_3$ luminescence. However, previous study has shown (see, for example, Coe, S. et al., *Nature*, 2002, 420, 800, which is incorporated by reference in its entirety) that the TAZ film is not planar when grown on the nanocrystal monolayer, due to chemical incompatibility of the aromatic TAZ with the aliphatic organics capping the nanocrystals. This results in physical contact of the $Alq_3$ film with some portions of the nanocrystal monolayer, contributing to $Alq_3$ electroluminescence in blue nanocrystal-LEDs.

The emission spectrum of the white nanocrystal-LED (FIG. 4) shows a pronounced contribution of red, green and blue nanocrystal electroluminescence components. The TPD electroluminescence signal is largely quenched due to the efficient energy transfer to the red and green nanocrystals. $Alq_3$ still appears to exhibit a weak spectral feature in the white nanocrystal-LED spectra analogous to the blue nanocrystal-LEDs. The white nanocrystal-LED pixels appear uniformly luminescent, look "white" to the eye (FIG. 3), with CIE coordinates (0.35, 0.41) at 9 V applied bias and CRI of 86, when compared to 5500K black body reference. Such high CRI compares favorably to other modern white light sources such as "cool white" fluorescent (CRI=62), incandescent (CRI=100), and dye enhanced InGaN/GaN solid state LEDs (CRI>80). See, for example, Krames, M. R. et al. *Phys. Stat. Sol. A*, 2002, 192, 237, which is incorporated by reference in its entirety.

Figure 5B:
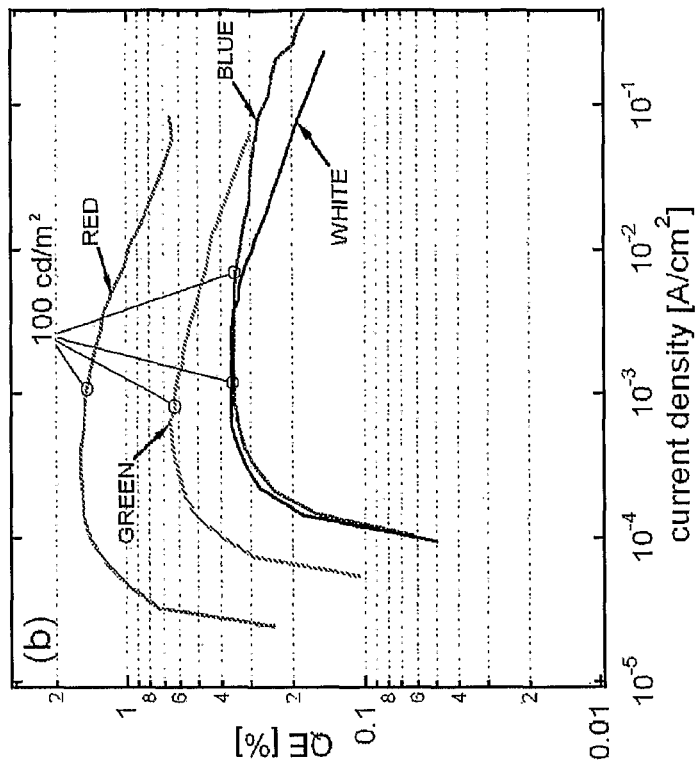
FIG. 5 is a diagram depicting current-voltage characteristics (a) and external electroluminescence quantum efficiency (b) measured for red, green, blue and white QD-LEDs labeled with red, green, blue and black lines, respectively. The arrows indicate the values at brightness of 100 cd/m$^2$.
Figure 5A:
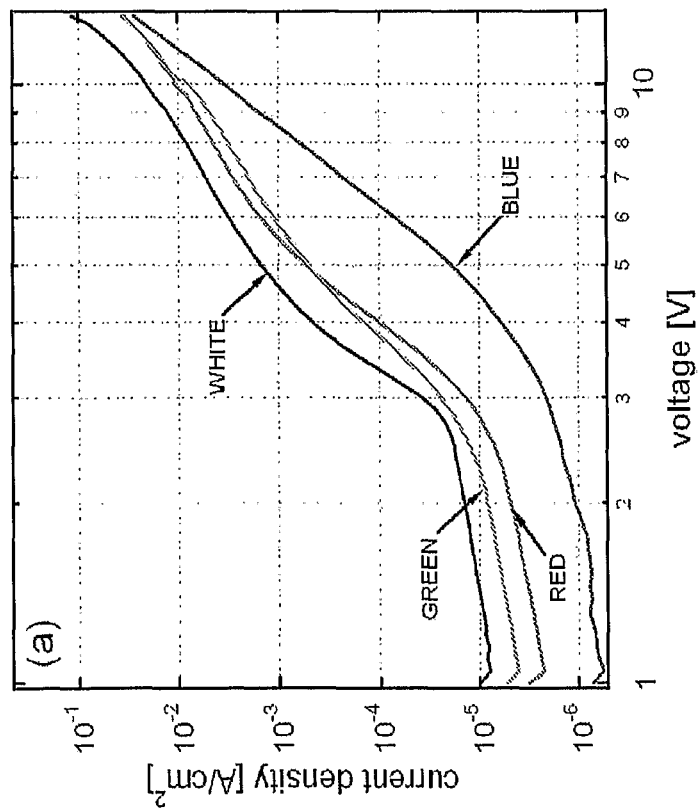

The peak external luminescence quantum efficiencies (EQEs) of a monochrome nanocrystal-LEDs are measured to be 1.6% at 4.6 V (0.29 $mA/cm^2$) for red devices, 0.65% at 5.2 V (0.63 $mA/cm^2$) for green, 0.35% at 9.1 V for blue (1.73 $mA/cm^2$) (FIG. 5). These values are all on the same order of magnitude as previously reported nanocrystal-LEDs (see, for example, Coe, S. et al. *Nature*, 2002, 420, 800, Steckel, J. S. et al., *Angew. Chem. Int. Ed.*, 2004, 43, 2154, Coe-Sullivan, S. et al. *Adv. Funct. Mater.*, 2005, 15, 1117, and S. Coe-Sullivan, PhD Thesis, Department of Electrical Engineering and Computer Science, Massachusetts Institute of Technology, 2005, each of which is incorporated by reference in its entirety), with a blue nanocrystal-LEDs 75% more efficient than previous reports (see, for example, Steckel, J. S. et al. *Angew. Chem. Int. Ed.*, 2004, 43, 2154, which is incorporated by reference in its entirety). The peak EQE of the white nanocrystal-LED is 0.36% at 5.0 V (1.51 $mA/cm^2$) (FIG. 5), which corresponds to 0.44 Cd/A and 0.28 $\mu m/W$, and brightness of 142 $cd/m^2$.

The significant difference between EQEs of the red, green and blue nanocrystal-LEDs can originate in the different mechanisms of operation for these devices. The two most common operating mechanisms proposed for nanocrystal-LEDs (see, for example, S. Coe-Sullivan, PhD Thesis, Department of Electrical Engineering and Computer Science, Massachusetts Institute of Technology, 2005, which is incorporated by reference in its entirety) can be as follows: In the first mechanism, electrons and holes transported by $Alq_3$/TAZ and TPD, respectively, are directly injected into the nanocrystals where they form excitons that can radiatively recombine. In the second mechanism, excitons formed on TPD resonantly transfer their energy to the nanocrystals which then radiate. See, for example, Förster, Th.; *Annalen der Physik*, 1948, 6, 55 and Kuhn, H.; *J. Chem. Phys.*, 1970, 53, 101, each of which is incorporated by reference in its entirety. If there are imperfections in the TAZ hole blocking layer, as described above for the blue devices, the $Alq_3$ film will also be in partial contact with nanocrystals and can either take energy form the more energetic blue nanocrystals, or transfer it back to red nanocrystals.

Figure 6:
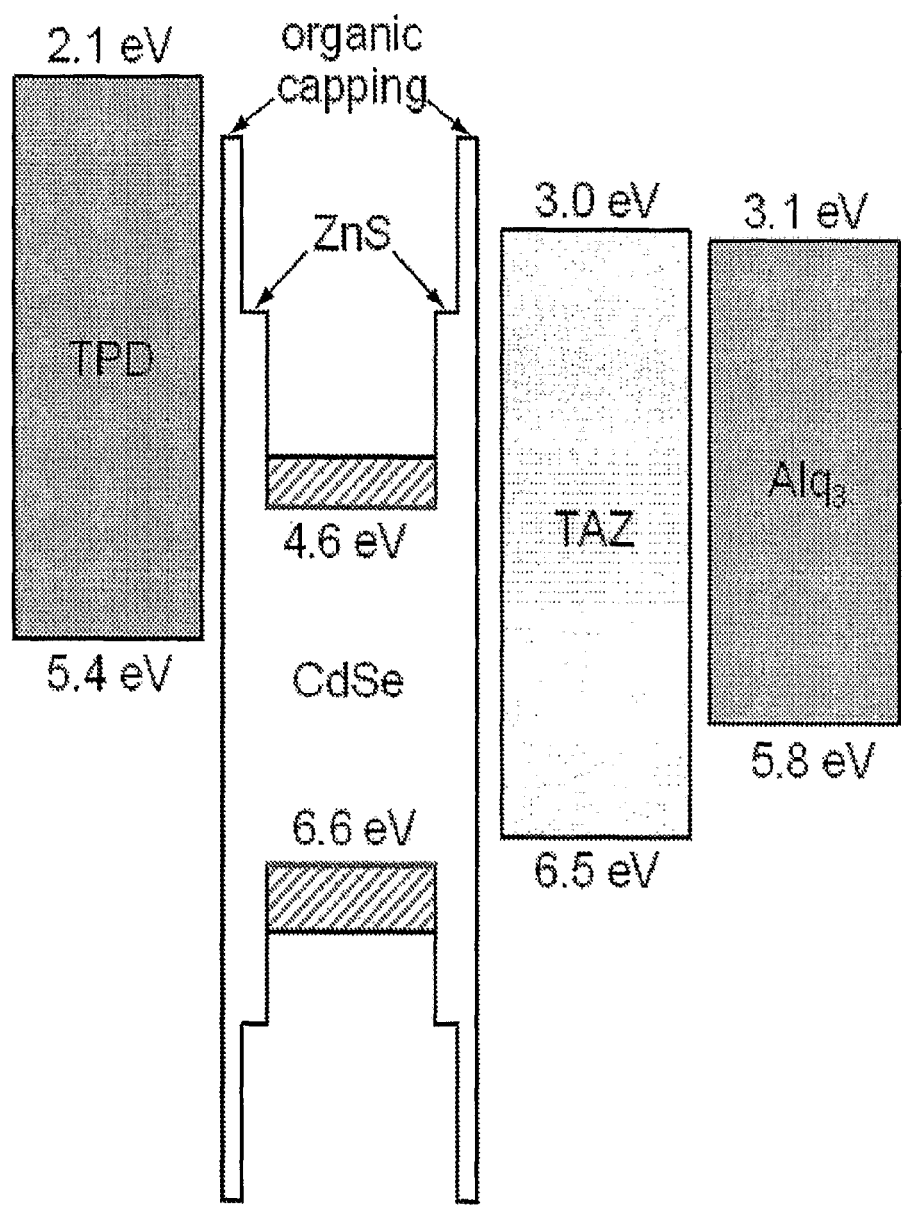
FIG. 6 is a diagram depicting suggested band structure for the QD-LEDs of this study. Conduction and valence band position for the red QDs are labeled with red energy levels; the shaded area shows the range of likely energy levels positions for the conduction and valence bands of the green and blue light emitting QDs.

In the red nanocrystal-LEDs, both direct charge injection and energy transfer from TPD and $Alq_3$ likely contribute to the high EQEs of these devices. In the green nanocrystal-LEDs direct charge injection could be similar as for red nanocrystal-LEDs if the green and red nanocrystal electron ground states are of similar energy (see FIG. 6). Also, energy transfer from the TPD to green nanocrystals should be efficient due to the significant overlap of TPD emission and green nanocrystal absorption spectra. However, any $Alq_3$ excitons that are formed (due to TAZ layer imperfections) will likely relax on $Alq_3$ molecules without transferring energy to green nanocrystal excitons of similar energy. Moreover, the photoluminescence efficiency of the green nanocrystal solutions used in these experiments (~65%) is lower than that of red nanocrystal solutions (90%), which also likely contributes to the lower efficiency of green nanocrystal-LEDs. One of the possible reasons for lower efficiency in the blue devices could be attributed to the efficacy of hole injection from TPD into the blue nanocrystals. Although we expect electron injection from $Alq_3$/TAZ into blue nanocrystals to be similar to electron injection into red and green nanocrystals, hole injection from TPD to blue nanocrystals could be obstructed by an additional potential barrier which leads to higher turn-on voltages and lower EQEs (FIG. 5) of blue nanocrystal-LEDs. This additional barrier could be ascribed to either the band lineup of the blue nanocrystal ground state electrons with the TPD hole transporting energy level, or alternatively to the difference in the energy needed to tunnel through the organic groups capping the blue nanocrystals. Additionally, the energy transfer from the TPD film to blue nanocrystals is not as efficient as for red or green nanocrystals, while at the same time blue nanocrystals can efficiently transfer their excitons to $Alq_3$ molecules. This poses an additional challenge for the blue nanocrystal-LEDs as the imperfections in the nanocrystal monolayer and TAZ film lead to charge transport directly through the organic layers, and thus more efficient exciton formation within TPD and $Alq_3$ layers than within the nanocrystals themselves. In the case of green and red nanocrystals, excitons formed in the gaps of the nanocrystal monolayer can be resonantly transferred to nanocrystals, but in the case of blue nanocrystals these excitons will radiatively recombine contributing to TPD and $Alq_3$ spectral features that are observed in the nanocrystal-LED electroluminescence spectra.

Figure 4C:
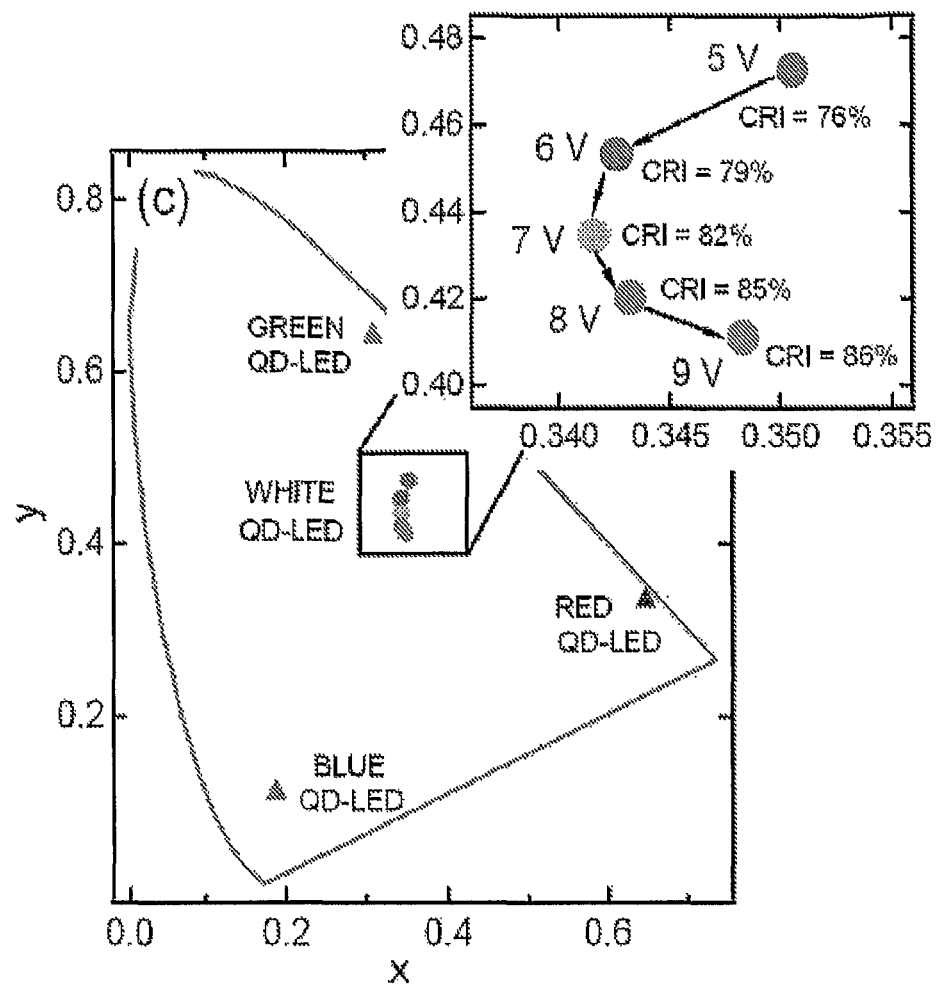

Since the white nanocrystal-LEDs contain three types of nanocrystals with different responses to charge injection, we expect the electroluminescence spectrum to depend on the device driving conditions. In FIG. 4(a) we show the electroluminescence spectrum color shift in a white nanocrystal-LED as we change the applied bias from 5 V to 9 V, resulting in slight change of the CIE coordinates and CRI, as shown in FIG. 4(c). With increasing voltage we observe the increase of the red and blue nanocrystal spectral components in the white nanocrystal-LED spectrum relative to the initially dominant green nanocrystal spectral component. This effect can in part be explained by analysis of the current-voltage (IV) characteristics of the red, green and blue monochrome nanocrystal-LEDs (FIG. 5(a)) and the proposed energy band diagram of FIG. 6. The blue nanocrystal-LED reaches video brightness at a higher voltage than the red and green devices. The higher resistance of the blue nanocrystal-LED for all currents can be ascribed to the higher energy barrier to the hole injection into the blue nanocrystals, necessitating a higher applied voltage to generate a blue nanocrystal exciton. In the white nanocrystal-LED, charge injection into the mixed nanocrystal film is dominated by injection into the green and red nanocrystals at low applied bias (5V). Since the nanocrystal mixture contains twice as many green nanocrystals as there are red nanocrystals, the larger fraction of the green nanocrystals contributes to a more intense green electroluminescence component as compared to red nanocrystal electroluminescence at low applied bias. Resonant energy transfer from green nanocrystals to the red nanocrystals is inhibited by the relatively small number of both red and green nanocrystals as compared to blue nanocrystals in the mixed nanocrystal monolayer, as the probability of locating a green nanocrystal next to a red nanocrystal is small. At higher applied biases charge injection into blue nanocrystals becomes more efficient, and the electroluminescence component of the blue nanocrystals becomes more significant. Increased exciton formation on blue nanocrystals also benefits red and green nanocrystal luminescence due to exciton energy transfer from blue nanocrystals to red and green nanocrystals. Note that the energy transfer to red nanocrystals is more efficient than to green nanocrystals due to an increased spectral overlap, with the consequence that with an increase of blue nanocrystal luminescence (at higher operating voltages), red nanocrystal luminescence rises more than the green nanocrystal luminescence. The exciton formation on the blue nanocrystals, that are most numerous in the mixed nanocrystal monolayer, governs the overall efficiency of the white device, as is reflected in the efficiency data of white nanocrystal-LEDs that closely tracks the efficiency of the monochrome blue nanocrystal-LEDs.

Figure 7:
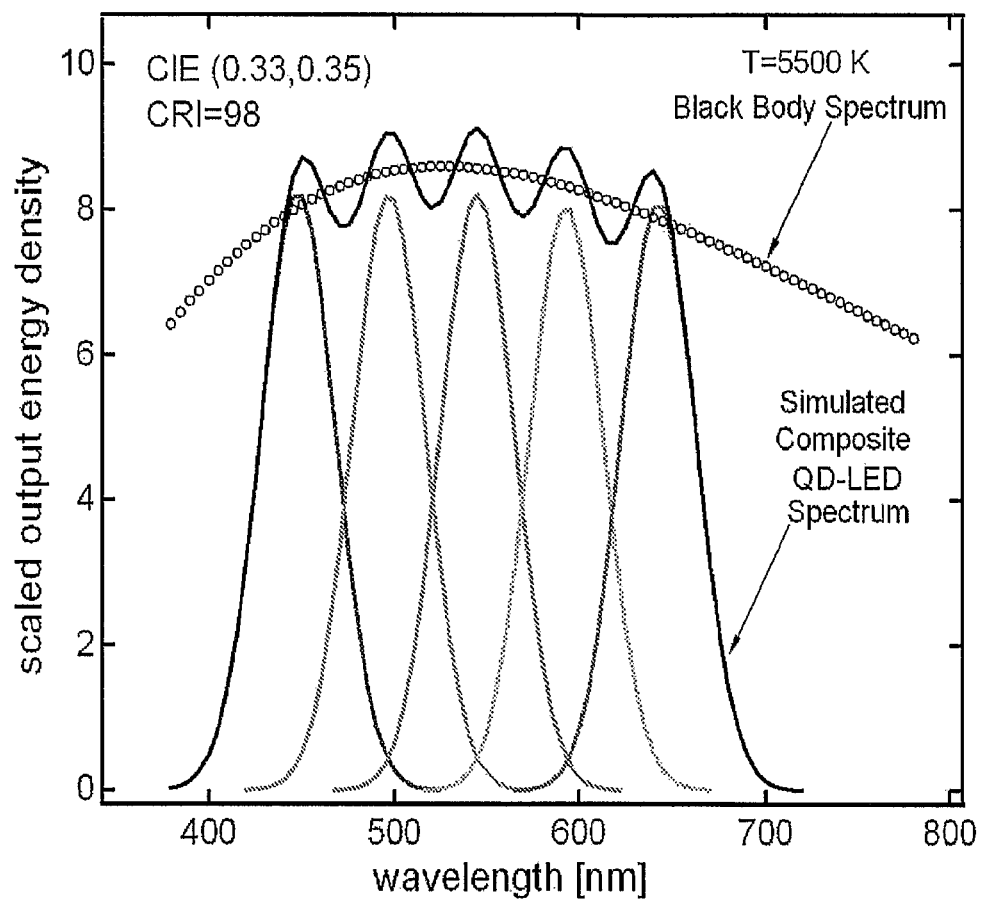
FIG. 7 is a diagram depicting a simulated QD-LED white light source with five QD lumophores each with 40 nm FWHM spectral emission. The composite emission spectrum has a color rendering index of CRI=98, while wasting no photons in the ultra-violet and the infra-red part of the spectrum. Superimposed is the emission spectrum of a black body source with T=5500K.

The operation of the white nanocrystal-LED is enabled by the use of identical electron transporting, hole blocking, and hole transporting layers in all of a monochrome nanocrystal-LEDs. Akin to mixing colors in a paint shop, in an ideal device the solutions of nanocrystals can be precisely mixed to achieve any desired spectrum. This is a unique capability of nanocrystal-LED sources that surpasses the tunability of the best OLEDs and it originates from the simplicity of the nanocrystal-LED design and the color purity of nanocrystal lumophores. An example of a simulated emission spectrum of a perfected white nanocrystal-LEDs is shown in FIG. 7, where by using five nanocrystal lumophores with 40 nm FWHM wide spectra white light source is constructed with CIE coordinates of (0.33, 0.35) and CRI=98. Note that such simulated device does not emit photons in the UV or IR part of the spectrum, maximizing the luminance efficiency.

Figure 8:
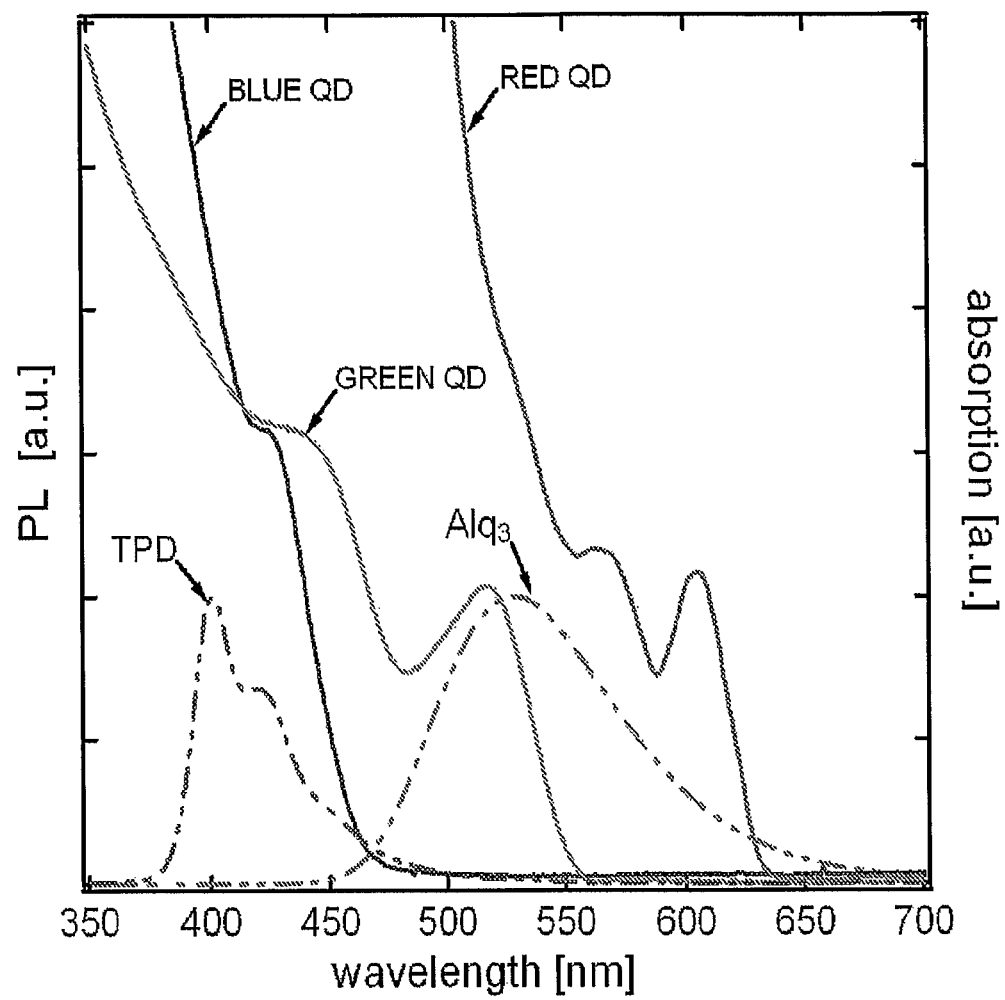
FIG. 8 is a diagram depicting red, green, and blue light emitting semiconductor nanocrystal ("QD") absorption spectra, labeled respectively, together with TPD and Alq$_3$ photoluminescence spectra, also labeled respectively, demonstrating spectral overlaps.

Referring to FIG. 8, red, green, and blue semiconductor nanocrystal ("QD") absorption spectra, labeled respectively, are shown together with TPD and $Alq_3$ photoluminescence spectra, also labeled respectively, demonstrating spectral overlaps.

This demonstrates the feasibility of using mixed nanocrystal films to create electroluminescent devices which spectra are a mixture of the component nanocrystals. Thus white luminescent nanocrystal-LEDs offer all the attractions of white OLEDs, including low cost materials, patterning and flexible substrates, and relatively high efficiencies, with the added durability and color tunability of nanocrystal emitters. As such, this nanocrystal-LED white light emitter may be the first step to using nanocrystals to developing new, more versatile mixed spectrum and white light technologies.

EXPERIMENTAL

Synthesis

To create three colors representing red, green and blue, (RBG) we used three different types of colloidal quantum dots (nanocrystals). The first type of nanocrystal is a CdSe/ZnS overcoated core-shell nanocrystal with photoluminescence maximum at $\lambda=622$ nm. The second type is ZnSe/CdSe/ZnS core-shell/alloy overcoated nanocrystals with photoluminescence maximum around $\lambda=540$ nm. The third type is a CdZnS alloy nanocrystal cores with photoluminescence maximum around $\lambda=440$ nm. Together these three types of nanocrystals constitute the component parts of an RGB color scheme. nanocrystal syntheses are largely adapted, from reported preparations (see, for example, Ivanov, S. A. et al. *J. Phys. Chem. B,* 2004, 108, 10625, and Zhong, X., et al, *J. Am. Chem. Soc.,* 2003, 125, 13559, each of which is incorporated by reference in its entirety), to achieve specific wavelength emitters with narrow distributions and maximum quantum yield. Color emission targets are chosen to best conform to areas of maximum detection for RGB in the human eye, at λ=620 nm, λ=530 nm and λ=470 nm, respectively, and thus to achieve the brightest possible appearance.

Red CdSe/ZnS core-shell nanocrystals, purchased from Quantum Dot Corporation, exhibit photoluminescence peak at λ=622 nm, and solution photoluminescence quantum yield near 90%.

Green emitting quantum dots were prepared by creating ZnSe/CdSe alloyed cores, as adapted from Ivanov, et al. *J. Phys. Chem. B*, 2004. 108, 10625, which is incorporated by reference in its entirety, and subsequently overcoated with ZnS. To do so, ZnSe cores were first prepared by injecting a solution of diethyl zinc, trioctylphosphine selenide (TOP-Se) and TOP into a flask of hexadecylamine (HDA) at 310° C. The cores were then grown at 270° C. for ~2 hours until the first absorption peak was at λ=354 nm. Then the solution, still visibly clear due to the high band gap of ZnSe, was cooled to 150° C. and immediately 5 ml of the growth solution was injected into a degassed solution of TOPO and hexylphosphonic acid (HPA). Immediately upon injection, a solution of dimethyl cadmium, TOP-Se and TOP was added dropwise at to the solvent/ZnSe mixture and the solution was heated at 150° C. for ~19 hours (no more than 2 days) until the emission was λ=540 nm. These cores, made of ZnSe and CdSe, were then twice precipitated using methanol/butanol and redissolved in hexane. This solution was then injected into a flask, at 80° C., of degassed TOPO and HPA, and hexane pulled off under vacuum for 1 hr. Two solutions, one containing dimethyl cadmium, diethyl zinc and TOP, the second containing $TMS_2$—S and TOP were added slowly to the flask at 150° C. by syringe pump at a rate of 2 ml/hr for ~2 hrs after which the solution was cooled to room temperature. The nanoparticles could then be precipitated using methanol/butanol as above and redispersed in hexane. This process was performed three times, filtering after each dispersion with a 0.21 μm filter, and redissolving, in the final step, in chloroform: The quantum yield of the ZnSe/CdSe/ZnS was measured to be ~65% using coumarin 540 as a reference (89% quantum yield in ethanol (Fletcher, A. N. et al., *Appl. Phys.*, 1978, 16, 289, which is incorporated by reference in its entirety)).

Blue emitting ZnCdS cores were prepared by injecting a syringe containing oleylamine and elemental sulfur into a flask, at 310° C. under argon, containing a clear solution of CdO and ZnO dissolved into oleic acid and octadecene, following, with some modifications, the work of Zhong, et al. *J. Am. Chem. Soc.*, 2003, 125, 13559, which is incorporated by reference in its entirety. The solution quickly turned from clear to yellow and remained stirring in the pot at 270° C. for ~30 minutes. Afterward the ZnCdS cores were precipitated by the addition of acetone to the growth solution and separated from the supernatant by centrifugation. Nanocrystals were then precipitated a second time using methanol/butanol, centrifuged and redispersed in chloroform, as described above. The quantum yield for the ZnCdS cores was found to be ~48% using coumarin 480 as a reference (99% quantum yield in ethanol, see, for example, Kubi, R. F.; A. N. Fletcher; *Chem. Phys. Lett.*, 1983, 99 1, 49, which is incorporated by reference in its entirety.)

Figure 3A:
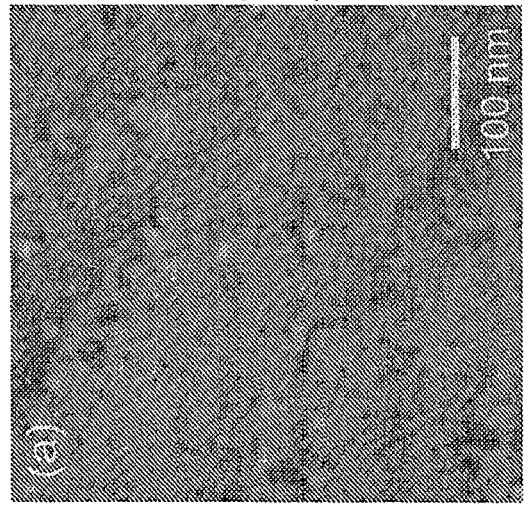

Device Fabrication:

All nanocrystals were received, stored and processed as nanoparticle solutions in chloroform. Solution concentrations were calibrated using atomic force microscopy (AFM) to produce a nanocrystal monolayer upon spin-casting (FIG. 3). All the organic films (except PEDOT:PSS) were thermally evaporated at pressures of <5×10$^{-7}$ torr and at rates of 0.1 nm/s. PEDOT:PSS films were spin-casted onto ITO substrates, and baked at 110 C.° for 15 min in $N_2$ atmosphere. ITO substrates for nanocrystal-LEDs and for AFM samples were cleaned in a multi-step solvent cleaning process followed by 5 min exposure to $O_2$ plasma. nanocrystal-LEDs were packaged in $N_2$ glovebox using glass coverslip and UV curing epoxy. Current-voltage characteristics and quantum efficiency measurements were taken with semiconductor parameter analyzer HP 4145B and a calibrated photodiode Newport 2101. Device brightness in photometric units (cd/m$^2$) was calculated in forward viewing direction assuming the Lambertian distribution of the electroluminescence. See, for example, Greenham, N. C. et al. *Adv. Mater.*, 1994, 6, 491, which is incorporated by reference in its entirety.

Other embodiments are within the scope of the following claims.

What is claimed is:

1. A light emitting device comprising:
    a first electrode;
    a hole injection layer in contact with the first electrode;
    a hole transporting layer in contact with the hole injection layer;
    a hole blocking layer;
    an electron transporting layer in contact with the hole blocking layer;
    a second electrode in contact with the electron transporting layer; and
    an electroluminescent layer comprising a pattern comprising a plurality of electroluminescent semiconductor nanocrystals including a mixture of red, green and blue light emitting electroluminescent nanocrystals, between the hole transporting layer and the hole blocking layer, wherein the plurality of electroluminescent semiconductor nanocrystals are patterned, and wherein light emission from one of the plurality of electroluminescent semiconductor nanocrystals corresponds to its band gap, and wherein the light emitting device has an external quantum efficiency of at least 0.20%,
    wherein the plurality of electroluminescent semiconductor nanocrystals comprise a Group II-VI compound, a Group II-V compound, a Group III-VI compound, a Group III-V compound, a Group IV-VI compound, a Group I-III-VI compound, a Group II-IV-VI compound, or a Group II-IV-V compound.

2. The light emitting device of claim 1, wherein the first electrode is a transparent electrode.

3. The light emitting device of claim 1, wherein the hole injection layer includes a conducting polymer.

4. The light emitting device of claim 1, wherein the hole transporting layer includes a benzidine.

5. The light emitting device of claim 1, wherein the hole blocking layer includes a triazole.

6. The light emitting device of claim 1, wherein the electron transporting layer includes a metal complex.

7. The light emitting device of claim 1, wherein the second electrode includes a metal.

8. The light emitting device of claim 1, wherein the plurality of electroluminescent semiconductor nanocrystals can include at least three distinct color emissions when excited.

9. The light emitting device of claim 1, wherein the plurality of electroluminescent semiconductor nanocrystals includes red, green and blue light emitting nanocrystals.

10. The light emitting device of claim 1, wherein the plurality of electroluminescent semiconductor nanocrystals includes a nanocrystal, wherein the nanocrystal includes a core.

11. The light emitting device of claim 10, further comprising an overcoating on the core, the overcoating including a second semiconductor material.

12. The light emitting device of claim 1, wherein the light emitting device has CIE coordinates of (0.35, 0.41).

13. The light emitting device of claim 1, wherein the light emitting device has a color rendering index (CRI) of 86 as compared to a 5500K black body reference.

14. The light emitting device of claim 1, wherein exciton formation on the blue light emitting electroluminescent nanocrystals in the mixture governs efficiency of the light emitting device.

15. The light emitting device of claim 1, wherein the color of the light emission varies by a voltage.

16. The light emitting device of claim 1, wherein the pattern comprises a monolayer of the plurality of electroluminescent semiconductor nanocrystals.

17. A light emitting device comprising:
a first electrode;
a hole injection layer in contact with the first electrode;
a hole transporting layer in contact with the hole injection layer;
a hole blocking layer;
an electron transporting layer in contact with the hole blocking layer;
a second electrode in contact with the electron transporting layer; and a pattern comprising a plurality of semiconductor nanocrystals including a mixture of red, green and blue light emitting nanocrystals, between the hole transporting layer and the hole blocking layer, wherein light emitted by the light emitting device has CIE coordinates of an x value between 0.340 and 0.355 and a y-value of between 0.40 and 0.48.

\* \* \* \* \*